United States Patent
Yan et al.

(10) Patent No.: US 12,484,388 B2
(45) Date of Patent: Nov. 25, 2025

(54) DISPLAY SUBSTRATE, MANUFACTURING METHOD THEREOF AND DISPLAY DEVICE

(71) Applicant: BOE Technology Group Co., Ltd., Beijing (CN)

(72) Inventors: Huajie Yan, Beijing (CN); Xiaohu Li, Beijing (CN); Renquan Gu, Beijing (CN); Qingyu Huang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 825 days.

(21) Appl. No.: 17/762,378

(22) PCT Filed: May 26, 2021

(86) PCT No.: PCT/CN2021/096094
§ 371 (c)(1),
(2) Date: Mar. 22, 2022

(87) PCT Pub. No.: WO2022/246694
PCT Pub. Date: Dec. 1, 2022

(65) Prior Publication Data
US 2023/0225169 A1    Jul. 13, 2023

(51) Int. Cl.
*H10K 59/124*    (2023.01)
*H10K 59/12*    (2023.01)
(Continued)

(52) U.S. Cl.
CPC ....... *H10K 59/124* (2023.02); *H10K 59/1201* (2023.02); *H10K 59/353* (2023.02);
(Continued)

(58) Field of Classification Search
CPC ............ H10K 59/124; H10K 59/1201; H10K 59/353; H10K 59/80518; H10K 59/875;
(Continued)

(56) References Cited

U.S. PATENT DOCUMENTS

| | | | |
|---|---|---|---|
| 9,680,123 B2 * | 6/2017 | Chen | H10K 59/80516 |
| 2011/0079815 A1 * | 4/2011 | Yamada | H10K 59/873 |
| | | | 438/22 |

(Continued)

FOREIGN PATENT DOCUMENTS

| | | |
|---|---|---|
| CN | 103928626 A | 7/2014 |
| CN | 104733632 A | 6/2015 |

(Continued)

OTHER PUBLICATIONS

Yu Luo et al., Flexible Organic Light-Emitting Diodes with Enhanced Light Out-Coupling Efficiency Fabricated on a Double-Sided Nanotextured Substrate, ACS Applied Materials & Interfaces 2014, 6, 10213-10219.

Mitsuhiro Koden, OLED displays and lighting, 1-222, 2017 John Wiley & Sons, Ltd.

*Primary Examiner* — Tan N Tran
(74) *Attorney, Agent, or Firm* — Ling Wu; Stephen Yang; Ling and Yang Intellectual Property

(57) ABSTRACT

Proposed are a display substrate, a manufacturing method thereof and a display device. The display substrate includes a base and multiple pixel units disposed on the base, wherein, at least one pixel unit of the multiple pixel units includes multiple sub-pixels with different colors, and at least one sub-pixel of the multiple sub-pixels includes multiple sub-pixel components with the same color; anodes of the sub-pixel components are electrically connected with driving circuits, and the driving circuits are independent of each other, and in a plane perpendicular to the display substrate, a side of the anode of the sub-pixel component away from the base at least includes a partial surface, and a normal of the partial surface is not perpendicular to the base.

14 Claims, 5 Drawing Sheets

(51) Int. Cl.
  *H10K 59/35*    (2023.01)
  *H10K 59/80*    (2023.01)
  *H10K 71/00*    (2023.01)
  *H10K 77/00*    (2023.01)
(52) U.S. Cl.
  CPC ..... *H10K 59/80518* (2023.02); *H10K 59/875* (2023.02); *H10K 71/00* (2023.02); *H10K 77/00* (2023.02); *H10K 59/80515* (2023.02)
(58) Field of Classification Search
  CPC .. H10K 71/00; H10K 77/00; H10K 59/80515; H10K 59/35; H04N 13/305
  See application file for complete search history.

(56) References Cited

U.S. PATENT DOCUMENTS

| | | | |
|---|---|---|---|
| 2018/0350888 A1* | 12/2018 | Huo | ............ H10K 59/122 |
| 2020/0058719 A1 | 2/2020 | Yeon et al. | |

FOREIGN PATENT DOCUMENTS

| | | | | |
|---|---|---|---|---|
| CN | 108346680 | A | | 7/2018 |
| CN | 108511493 | A | | 9/2018 |
| CN | 111403628 | A | | 7/2020 |
| CN | 111799384 | A | | 10/2020 |
| JP | 2002170663 | A | * 6/2002 | ........... G03F 7/0002 |
| JP | 2011018468 | A | * 1/2011 | |
| JP | 2017-142946 | A | | 8/2017 |
| KR | 10-2020-0021016 | A | | 2/2020 |
| TW | 200520604 | A | | 6/2005 |

\* cited by examiner

US 12,484,388 B2

DISPLAY SUBSTRATE, MANUFACTURING METHOD THEREOF AND DISPLAY DEVICE

CROSS-REFERENCE TO RELATED APPLICATION

The present application is a U.S. National Phase Entry of International Application No. PCT/CN2021/096094 having an international filing date of May 26, 2021, the content of which is hereby incorporated by reference.

TECHNICAL FIELD

Embodiments of the present disclosure relate to, but not limited to, the field of display technologies, and in particular to a display substrate, a manufacturing method thereof and a display device.

BACKGROUND

A main principle of 3D display technology is that a viewer's left eye and right eye receive different images, respectively, and the images of the left eye and the right eye are analyzed and overlapped by human brain, so that the viewer may perceive the layering of the images, thereby generating stereoscopic impression. 3D naked-eye display technology is a research hotspot of 3D display technology.

According to different display principles, the 3D naked-eye display technology may be divided into grating naked-eye 3D technology and lenticular lens 3D display technology. A left view and a right view are formed by a grating-like parallax barrier or a lenticular lens. Since the left view and the right view seen by both eyes of the viewer are two images with parallax, after the left view and the right view with parallax are superimposed and reborn in the viewer's brain, the viewer may watch a 3D display image with naked eyes.

SUMMARY

The following is a summary for subject matters described in detail herein. The summary is not intended to limit the scope of protection of claims.

An embodiment of the present disclosure provides a display substrate including a base and multiple pixel units disposed on the base, wherein: at least one pixel unit of the multiple pixel units includes multiple sub-pixels with different colors, and at least one sub-pixel of the multiple sub-pixels includes multiple sub-pixel components with the same color; anodes of the sub-pixel components are electrically connected with driving circuits, and the driving circuits are independent of each other, and in a plane perpendicular to the display substrate, a side of the anode of the sub-pixel component away from the base at least includes a partial surface, and a normal of the partial surface is not perpendicular to the base; In an exemplary embodiment, in the plane perpendicular to the display substrate, the display substrate includes the base, and a planarization layer, an anode, an organic light emitting layer and a cathode which are stacked sequentially on the base, and in at least one sub-pixel region, the planarization layer includes multiple protrusions corresponding to the multiple the sub-pixel components one-to-one; and the base includes multiple driving circuits, the planarization layer is disposed with multiple vias, and the anode of the sub-pixel component is electrically connected with a driving circuit through the via on the planarization layer.

In an exemplary embodiment, in at least one sub-pixel region, the multiple protrusions are multiple spherical crown-shaped protrusions arranged on the base in an array or a row-by-row staggered arrangement.

In an exemplary embodiment, in one sub-pixel region, one spherical crown-shaped protrusion has a spherical radius of 300 nm to 1800 nm.

In an exemplary embodiment, an anode of at least one sub-pixel component is shaped as a first spherical housing covering the planarization layer, an organic light emitting layer of at least one sub-pixel component is shaped as a second spherical housing covering the anode, and anodes of the adjacent sub-pixel components are isolated from each other by the organic light emitting layer; in at least one sub-pixel region, organic light emitting layers of the multiple the sub-pixel components are continuous.

In an exemplary embodiment, a distance between spherical centers of the anodes of the adjacent sub-pixel components is 2 μm to 100 μm; the first spherical housing corresponding to the anode of at least one sub-pixel component has a radius of 100 nm to 8000 nm.

In an exemplary embodiment, the first spherical housing corresponding to the anode of at least one sub-pixel component has an arc of $\pi/6$ to $3\pi/2$.

In an exemplary embodiment, the anode includes a first conductive layer, a reflective layer, and a second conductive layer which are stacked; the first conductive layer and the second conductive layer each have a thickness of 10 nm to 50 nm; and the reflective layer has a thickness of 80 nm to 200 nm.

In an exemplary embodiment, in at least one sub-pixel region, the multiple protrusions are multiple semi-cylinder-shaped protrusions arranged on the base in rows or columns.

In an exemplary embodiment, in one sub-pixel region, one semi-cylinder-shaped protrusion has a bottom surface radius of 600 nm to 700 nm.

In an exemplary embodiment, the anode of at least one sub-pixel component is shaped as a first ring cylinder covering the planarization layer, the organic light emitting layer of at least one sub-pixel component is shaped as a second ring cylinder covering the anode, and the anodes of the adjacent sub-pixel components are isolated from each other by the organic light emitting layer; in at least one sub-pixel region, the organic light emitting layers of the multiple the sub-pixel components are continuous.

In an exemplary embodiment, a distance between bottom surface circular centers of the anodes of the adjacent sub-pixel components is 2 μm to 100 μm; and the first ring cylinder corresponding to the anode of at least one sub-pixel component has a bottom surface radius of 100 nm to 8000 nm.

In an exemplary embodiment, the first ring cylinder corresponding to the anode of at least one sub-pixel component has an arc of $\pi/6$ to $3\pi/2$.

In an exemplary embodiment, the anode includes a first conductive layer, a reflective layer, and a second conductive layer which are stacked; and the first conductive layer and the second conductive layer each have a thickness of 10 nm to 50 nm; the reflective layer has a thickness of 80 nm to 200 nm.

An embodiment of the present disclosure further provides a display device including any one of the above display substrates.

An embodiment of the present disclosure further provides manufacturing method of a display substrate, including: forming a base including multiple driving circuits independent of each other; and forming multiple pixel units on the base, at least one pixel unit of the multiple pixel units including multiple sub-pixels with different colors, and at least one sub-pixel of the multiple sub-pixels including multiple sub-pixel components with the same color; anodes of the sub-pixel components being electrically connected with the driving circuits, and in a plane perpendicular to the display substrate, a side of the anode of the sub-pixel component away from the base at least including a partial surface, and a normal of the partial surface being not perpendicular to the base.

In an exemplary embodiment, the forming the multiple pixel units on the base includes: forming a planarization layer on the base, in at least one sub-pixel region, the planarization layer including multiple protrusions corresponding to multiple sub-pixel components one-to-one, and multiple vias being disposed on the planarization layer; forming an anode on the planarization layer, the anodes of the sub-pixel components covering the multiple protrusions, and an anode of at least one sub-pixel component being electrically connected with at least one driving circuit through the via on the planarization layer; and sequentially forming an organic light emitting layer and a cathode on the anode.

In an exemplary embodiment, the anode includes a first conductive layer, a reflective layer, and a second conductive layer; the forming the anode on the planarization layer includes: depositing a first conductive thin film, and forming a pattern of the first conductive layer through a first patterning process; depositing a reflective layer thin film, and forming a pattern of the reflective layer through a second patterning process; and depositing a second conductive thin film, and forming a pattern of the second conductive layer through a third patterning process.

In an exemplary embodiment, the reflective layer has a thickness of 80 nm to 200 nm; the first conductive layer and the second conductive layer each have a thickness of 10 nm to 50 nm.

In an exemplary embodiment, in at least one sub-pixel region, the multiple protrusions are multiple spherical crown-shaped protrusions arranged on the base in an array or a row-by-row staggered arrangement.

In an exemplary embodiment, in at least one sub-pixel region, the multiple protrusions are multiple semi-cylinder-shaped protrusions arranged on the base in rows or columns.

Other aspects will become apparent upon reading and understanding accompanying drawings and the detailed description.

DETAILED DESCRIPTION

Figure 1:
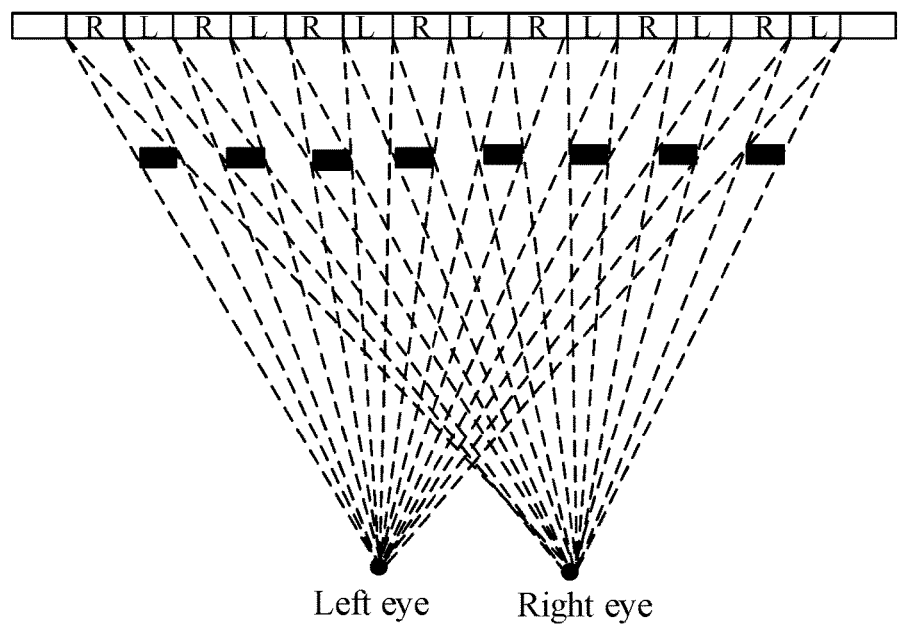
FIG. 1 is a schematic diagram of a principle of a display substrate for realizing 3D naked-eye display.

The embodiments of the present disclosure will be described in detail below with reference to the accompanying drawings. The implementations may be implemented in various forms. A person skill in the art may easily understand such a fact that manners and contents may be transformed into various forms without departing from spirit and scope of the present disclosure. Therefore, the present disclosure should not be construed as only being limited to the contents recorded in the following implementations. The embodiments in the present disclosure and features in the embodiments may be combined arbitrarily with each other without conflict.

In the accompanying drawings, a size of each constituent element, a thicknesses of a layer, or a region may be exaggerated sometimes for clarity. Therefore, the implementation of the present disclosure is not always limited to the size, and the shapes and sizes of each component in the accompanying drawings do not reflect the true scale. In addition, the accompanying drawings schematically show ideal examples, and implementations of the present disclosure are not limited to the shapes or values shown in the accompanying drawings.

Ordinal numerals such as "first", "second", and "third" in the specification are set to avoid confusion of constituent elements, but are not intended to limit in terms of quantity.

In the specification, for convenience, words and sentences indicating orientations or positional relationships, such as "center", "upper", "lower", "front", "back", "vertical", "horizontal", "top", "bottom", "inside", and "outside", are used for describing positional relationships of constituent elements with reference to the accompanying drawings, and are merely for facilitating describing the specification and simplifying the description, rather than indicating or implying that referred apparatuses or elements must have particular orientations, and be constructed and operated in particular orientations. Thus, it cannot be construed as a limitation to the present disclosure. The positional relationships of the constituent elements appropriately change according to directions of describing the constituent elements. Therefore, it is not limited to the words and sentences described in the specification, which may be replaced appropriately according to a situation.

In the specification, unless otherwise specified and defined explicitly, terms "mounted", "mutually connected", and "connection" should be broadly understood. For example, it may be fixed connection, detachable connection or integrated connection, may be mechanical connection or connection, or may be direct connection, indirect connection through intermediate components, or communication inside two components. Those of ordinary skills in the art may understand the meanings of the above terms in the present disclosure according to situations.

In the specification, a transistor refers to an element that at least includes three terminals, namely a gate electrode, a drain electrode, and a source electrode. The transistor has a channel region between the drain electrode (a drain electrode terminal, a drain region, or the drain electrode) and the source electrode (a source electrode terminal, a source region, or the source electrode), and current may flow through the drain electrode, the channel region, and the source region. In the specification, the channel region refers to a region through which the current mainly flows.

In the specification, it is possible that a first electrode is the drain electrode and a second electrode is the source electrode, or, it is also possible that the first electrode is the source electrode and the second electrode is the drain electrode. In the housing that transistors with opposite polarities are used, or a direction of current changes during operation of a circuit, or the like, functions of the "source electrode" and "drain electrode" may sometimes be interchangeable. Therefore, the "source electrode" and "drain electrode" may be interchangeable in the specification.

In the specification, "connection" includes a situation in which constituent element are connected with each other through an element having some electrical function. There is no specific restriction on the "element having some electrical function" as long as it may transmit and receive electrical signals between the connected constituent elements. An example of the "element having some electrical function" includes not only an electrode and a wiring, but also a switching element such as a transistor, a resistor, an inductor, a capacitor, and other elements having various functions, and the like.

In the specification, "parallel" refers to a state in which an angle formed between two straight lines is greater than −10° and smaller than 10°, and thus may also include a state in which the angle is greater than −5° and smaller than 5°. In addition, "perpendicular" refers to a state in which the angle formed between two straight lines is greater than 80° and smaller than 100°, and thus may also include a state in which the angle is greater than 85° and smaller than 95°.

In the specification, "film" and "layer" may be interchangeable. For example, a "conductive layer" may sometimes be replaced with a "conductive film." Similarly, an "insulating film" may sometimes be replaced with an "insulating layer."

Naked-eye 3D display technology mainly includes holographic 3D display technology, volume 3D display technology, autostereoscopic 3D display technology and so on. The autostereoscopic 3D display technology has been considered as the fastest commercialized naked-eye 3D display technology due to its dynamic, color and large field-of-view 3D display effects. The autostereoscopic 3D display technology includes naked-eye 3D display technology based on geometrical optics, such as cylindrical lens array technology, parallax barrier technology, and microlens array technology. This kind of technology is mainly based on the principle of travelling in straight line, reflection and refraction of light. Images from different angles of view are projected at different viewpoint positions by designing a structure to change an emergent direction of each pixel in a display screen, so that people's left and right eyes can watch the images from different angles of view, thereby forming stereoscopic vision sense.

An optical screens for naked-eye 3D display usually need to display multi-viewpoints images with parallax. The multi-viewpoints images displayed on the screen are separated into different visual regions by optical separation components, and an audience can only observe one viewpoint image in a certain visual region. When left and right eyes of the audience are in the left and right different visual regions at the same time, the horizontal parallax between the left and right viewpoint images is fused by the brain to generate correct depth information. Naked-eye stereoscopic display technology may interleave and render the multi-viewpoint images through spatial multiplexing, that is, firstly, multiple viewpoint images are divided into multiple sub-images in strip or block, and then interleaved (a part of sub-images in strip or block are selected from each viewpoint image in turn according to a certain rule) and merged into a single image for stereoscopic display, as shown in FIG. 1.

Based on existing display products, especially a mobile phone display screen, the naked-eye 3D display effect is achieved, which has the defects of low PPI, less information, small 3D angle of view, etc., and is easy to make people dizzy and has poor user experience. In order to solve these problems of the naked-eye 3D display technology of mobile phones, RGB pixels may be patterned again, and high-resolution naked-eye 3D display can be realized through design of a laminated anode structure. However, when anodes of the RGB pixels for display panels in some technologies is divided, there are too many dividing lines of subdivided sub-pixels, too many gaps between the anodes of the subdivided sub-pixels, and a large blank space, which are prone to generation of poor Moire fringes. Moreover, it is difficult to achieve seamless splicing of anodes of the sub-pixel designed by the laminated anode structure, and the process is limited.

Embodiments of the present disclosure provide a display substrate, including multiple pixel units. At least one pixel unit of the multiple pixel units includes multiple sub-pixels with different colors, and at least one sub-pixel of the multiple of sub-pixels includes multiple sub-pixel components with the same color. An anode of at least one sub-pixel component is electrically connected with a driving circuit, and multiple driving circuits are independent of each other, and in a plane perpendicular to the display substrate, a side of the anode of at least one sub-pixel component away from the base at least includes a partial surface, and a normal of the partial surface is not perpendicular to the base.

Some embodiments of the present disclosure also provide a display device and a manufacturing method corresponding to the display substrate.

In the display substrate provided in the above embodiments of the present disclosure, the pixel unit is divided into multiple sub-pixels, at least one sub-pixel is divided into multiple sub-pixel components, and the side of the anode of at least one sub-pixel component away from the base includes at least the partial surface, and the normal of the partial surface is not perpendicular to the base, thereby reducing etching deviation, greatly reducing a anode gap between adjacent sub-pixel components and improving the PPI. Moreover, segment difference of the anodes of the sub-pixel components of the display substrate of the embodiment of the present disclosure is small, thereby achieving continuous luminescence between sub-pixel components, reducing the influence of Moire fringes and improving the naked-eye 3D display effect.

Figure 2:
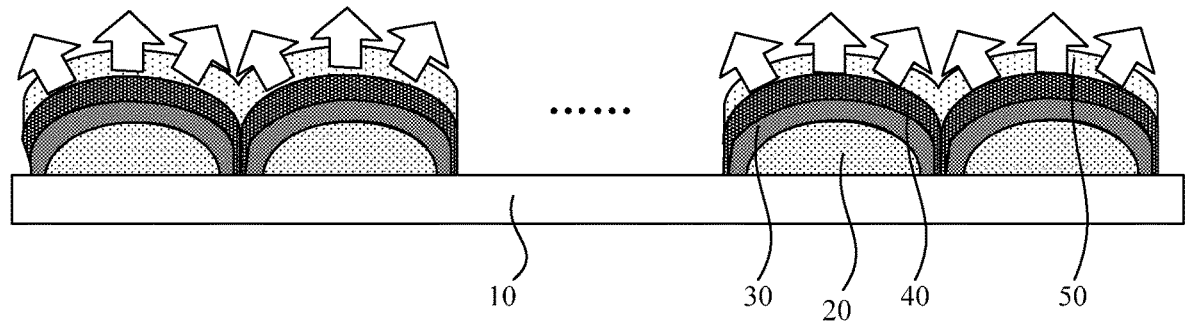
FIG. 2 is a schematic diagram of a structure of a cross-sectional shape of a display substrate according to an embodiment of the present disclosure.

FIG. 2 is a schematic diagram of a structure of a display substrate according to an embodiment of the present disclosure. As shown in FIG. 2, in the present embodiment, in a plane perpendicular to the display substrate, the display substrate includes a base 10 and a planarization layer 20, an anode 30, an organic light emitting layer 40, and a cathode 50 which are sequentially stacked on the base 10. In at least one sub-pixel region, the planarization layer 20 includes multiple protrusions corresponding to multiple sub-pixel components one-to-one.

The base 10 includes multiple driving circuits (not shown in the figure), multiple vias (not shown in the figure) are disposed on the planarization layer 20, and the anode 30 of at least one sub-pixel component is electrically connected to one of the driving circuits through the vias on the planarization layer 20.

In the embodiment of the present disclosure, according to different usage requirements, the sub-pixel includes different quantity of sub-pixel components. The more the sub-pixel components included in one sub-pixel are, the finer the display effect is. In an exemplary embodiment, one sub-pixel may include 1*n sub-pixel components or n*n sub-pixel components where n is a natural number greater than or equal to 1.

In an exemplary embodiment, anodes of sub-pixel components of the same row at the same viewpoint are connected to the same scan line; anodes of sub-pixel components of the same column at the same viewpoint are connected to the same data line.

In an exemplary embodiment, holes of the anodes of the sub-pixel components at the same viewpoint are disposed on the same straight line.

Figure 3:
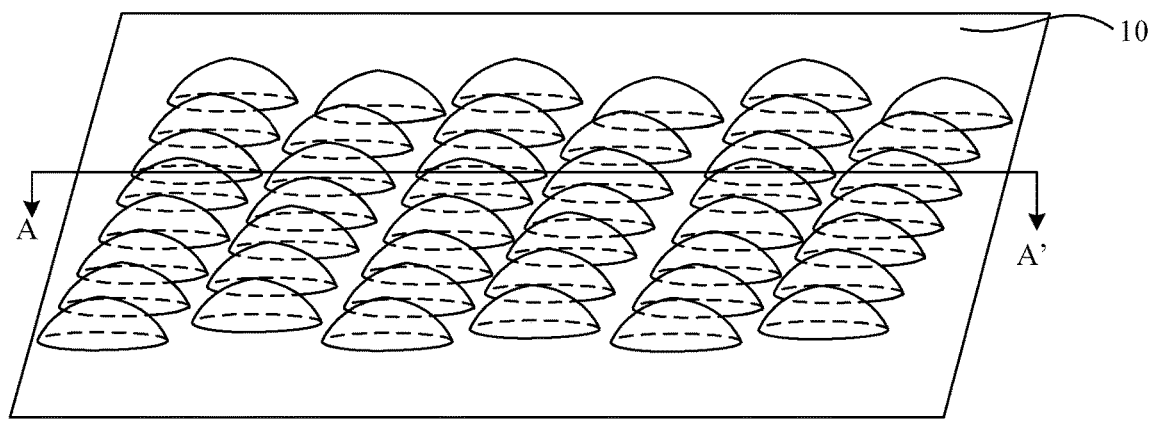
FIG. 3 is a schematic diagram of a three-dimensional structure of a display substrate according to an embodiment of the present disclosure.
Figure 4:
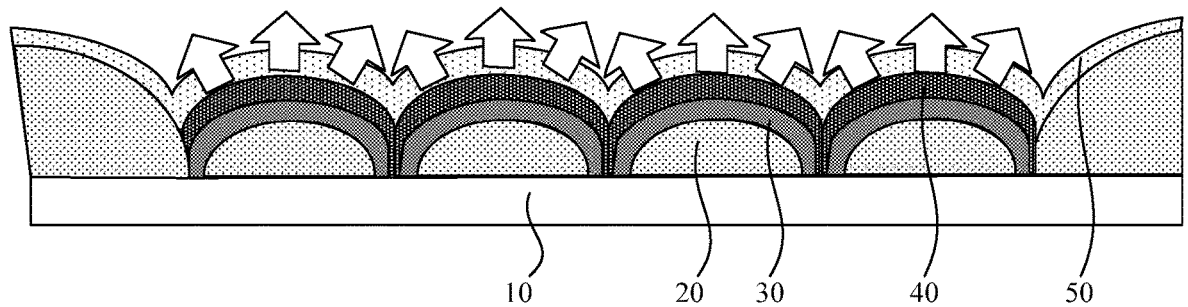
FIG. 4 is a schematic diagram of a cross-sectional shape of a AA' region of a display substrate shown in FIG. 3.

In an exemplary embodiment, as shown in FIG. 3 and FIG. 4, in at least one sub-pixel region, the multiple protrusions are multiple spherical crown-shaped protrusions arranged on the base 10 in an array or row-by-row staggered arrangement.

In an exemplary embodiment, the spherical crown-shaped protrusion may be a ¼ spherical protrusion, a hemispherical protrusion, or any other spherical crown-shaped protrusions having any size, or may be a spherical crown-like shaped protrusion, for example, an arcuate protrusion.

In an exemplary embodiment, in one sub-pixel region, one spherical crown-shaped protrusion may have a spherical radius of 300 nm to 1800 nm. Exemplarily, in one sub-pixel region, one spherical crown-shaped protrusion may have the spherical radius of 600 nm to 700 nm, for example, 650 nm.

In an exemplary embodiment, the spherical radii of all spherical crown-shaped protrusions are consistent in order to achieve uniformity of display effect and reduce process complexity.

In an exemplary embodiment, the anode 30 of at least one sub-pixel component is shaped as a first spherical housing covering the planarization layer 20, the organic light emitting layer 40 of at least one sub-pixel component is shaped as a second spherical housing covering the anode 30, and the anodes 30 of adjacent sub-pixel components are isolated from each other by the organic light emitting layer 40. In at least one sub-pixel region, the organic light emitting layers 40 of the multiple sub-pixel components are continuous.

The spherical anode 30 of the display substrate in the embodiment of the present disclosure may reflect light to surroundings, thereby achieving continuous luminescence of subdivided sub-pixels with a single-layer anode structure, increasing the luminous area of the sub-pixels, and reducing the influence of the Moire fringes to the lowest after passing through the metasurface secondary pixel lenticular lens. It solves the problems of low visual resolution and discontinuous views present in the current naked-eye 3D display technology and make the visible area of 3D views larger and closer to the real world.

In an exemplary embodiment, any one or more of the first spherical housing and the second spherical housing may be a spherical crown-shaped or a spherical crown-like shaped structure, and the spherical crown shape may be a ¼ spherical shape, a hemispherical shape, or any other spherical crown shape having any size, and the spherical crown-like shape may be an arcuate shape, etc.

In an exemplary embodiment, in one sub-pixel region, a distance between the spherical centers of the anodes 30 of the adjacent sub-pixel components may be 2 μm to 100 μm (including micro-display high PPI and large-size TV display, and the like). Exemplarily, the adjacent distance may be 4 μm.

Theoretically, in one sub-pixel region, on the premise that disconnection between the anodes of the adjacent sub-pixel components may be ensured, the smaller the distance is, the more favorable the realization of 3D display effect is.

In an exemplary embodiment, the first spherical housing corresponding to the anode 30 of at least one sub-pixel component may have a radius of 100 nm to 8000 nm. Exemplarily, the first spherical housing corresponding to the anode 30 of at least one sub-pixel component may have the radius of 1200 nm.

In an exemplary embodiment, the first spherical housing corresponding to the anode 30 of at least one sub-pixel component has an arc of $\pi/6$ to $3\pi/2$. Exemplarily, the first spherical housing corresponding to the anode 30 of at least one sub-pixel component may have the arc of $\pi/2$.

Figure 5:
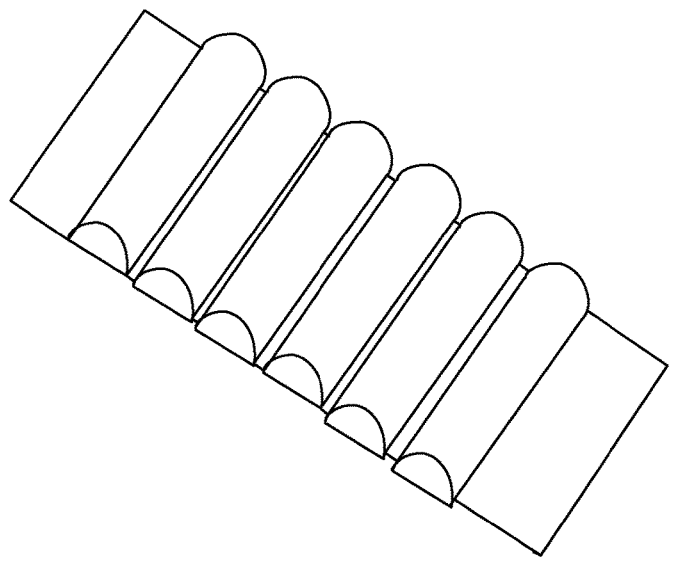
FIG. 5 is another schematic diagram of a three-dimensional structure of a display substrate according to an embodiment of the present disclosure.

In another exemplary embodiment, as shown in FIG. 5, in at least one sub-pixel region, the multiple protrusions are semi-cylinder-shaped protrusions arranged on the base 10 in rows or columns.

In an exemplary embodiment, a cross-sectional shape of the semi-cylinder-shaped protrusion may be semi-circular, ¼-circular, or any other spherical crown having any size.

In other exemplary embodiments, in at least one sub-pixel region, the multiple protrusions may also be polygonal prism protrusions arranged on the base 10 in rows or columns, where a cross-sectional shape of the polygonal prism protrusion may be polygonal.

Since one sub-pixel may include hundreds of sub-pixel components, FIG. 4 and FIG. 5 do not draw all the protrusions in one sub-pixel region, but only show some of the protrusions, that is, a quantity of protrusions illustrated in FIG. 4 and FIG. 5 does not represent a quantity of protrusions actually included in one sub-pixel region.

In an exemplary embodiment, in one sub-pixel region, one semi-cylinder-shaped protrusion may have a bottom surface radius of 600 nm to 700 nm. Exemplarily, in each sub-pixel region, one semi-cylinder-shaped protrusion may have the bottom surface radius of 650 nm.

In an exemplary embodiment, the anode 30 of at least one sub-pixel component is shaped as a first ring cylinder covering the planarization layer 20, the organic light emitting layer 40 of at least one sub-pixel component is shaped as a second ring cylinder covering the anode 30, and the anodes 30 of adjacent sub-pixel components are isolated from each other through the organic light emitting layer 40.

In at least one sub-pixel region, the organic light emitting layers 40 of the multiple sub-pixel components are continuous.

In an exemplary embodiment, in one sub-pixel region, a distance between bottom surface circular centers of the anodes 30 of the adjacent sub-pixel components may be 2 μm to 100 μm (including micro-display high PPI and large-size TV display, and the like). Exemplarily, the distance between the bottom surface circular centers of the anodes 30 of the adjacent sub-pixel components may be 4 μm.

In an exemplary embodiment, the ring cylinder corresponding to the anode 30 of at least one sub-pixel component may have a bottom surface radius of 100 nm to 8000 nm. Exemplarily, the ring cylinder corresponding to the anode 30 of at least one sub-pixel component has the bottom surface radius of 1200 nm.

In an exemplary embodiment, the ring cylinder corresponding to the anode 30 of at least one sub-pixel component may have the arc of $\pi/6$ to $3\pi/2$.

In the display substrate of the embodiment of the present disclosure, the planarization layer 20 is etched into a semi-cylinder-shaped structure, and then the anode 30 is deposited on the planarization layer 20, and a material for the anode 30 can be ITO/AG/ITO. The actual verification results show that after adopting the structure of the planarization layer 20 and the anode 30 of the embodiment of the present disclosure, the ring cylinder-shaped anode 30 of the display substrate may reflect light to both sides, which may also achieve continuous luminescence of subdivided sub-pixels with a single-layer anode structure, increase the luminous area of the sub-pixels, and reduce the influence of the Moire fringes to the lowest after passing through the metasurface secondary pixel lenticular lens. It solves the problems of low visual resolution and discontinuous views present in the current naked-eye 3D display technology and make the visible area of 3D views larger and closer to the real world.

Figure 6:
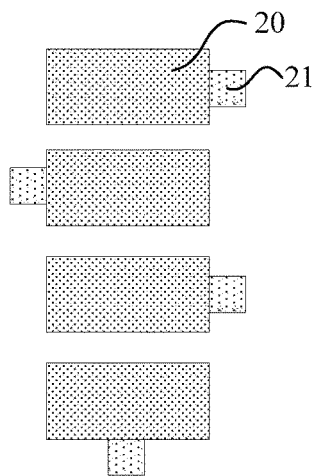
FIG. 6 is a schematic diagram of via position disposition of a planarization layer of a display substrate shown in FIG. 5.

In an exemplary embodiment, as shown in FIG. 6, a via 21 is disposed on the planarization layer 20, the planarization layer 20 in the via 21 is etched away to expose a surface of a drain electrode of a thin film transistor, and a position of the via 21 may be disposed at a position around the semi-cylinder-shaped protrusion. As for the spherical crown-shaped protrusion shown in FIG. 2, the position of the via 21 may be disposed at the position around the spherical crown-shaped protrusion.

Figure 7:
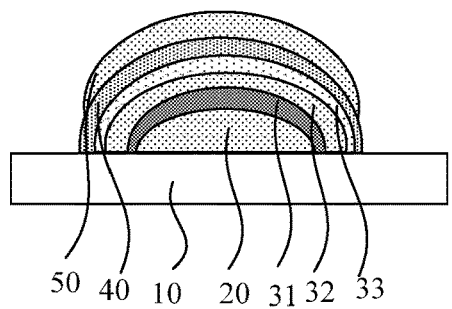
FIG. 7 is a schematic diagram of a structure of a cross-sectional shape of one sub-pixel component of a display substrate according to an embodiment of the present disclosure.

In an exemplary embodiment, as shown in FIG. 7, the anode 30 includes a first conductive layer 31, a reflective layer 32, and a second conductive layer 33 which are stacked. A material for the first conductive layer 31 may be indium tin oxide (ITO) or molybdenum (Mo), a material for the second conductive layer 33 may be indium tin oxide (ITO) or molybdenum (Mo), a material for the second conductive layer 33 may be the same as or different from the material for the first conductive layer 31, and a material for the reflective layer 32 may be silver (Ag), molybdenum (Mg), aluminum (Al) or aluminum-neodymium alloy (AlNd), etc. Thicknesses of the first conductive layer 31 and the second conductive layer 33 each are 10 nm to 50 nm. Exemplarily, the thicknesses of the first conductive layer 31 and the second conductive layer 33 may each be 15 nm. A thickness of the reflective layer 32 (such as Ag or AlNd, etc.) may be 80 nm to 200 nm. Exemplarily, the thickness of the reflective layer 32 may be 100 nm. The thicknesses may be set according to actual conditions.

Figure 8:
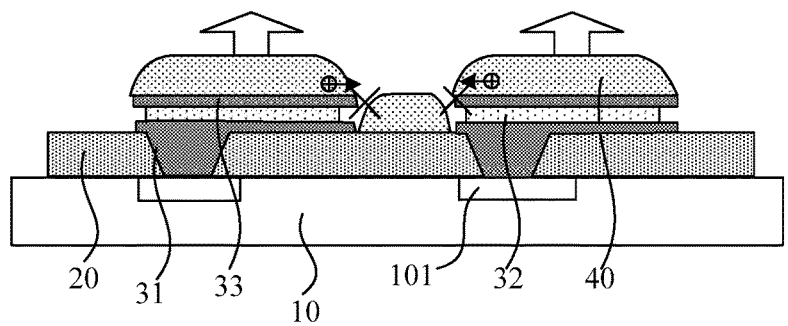
FIG. 8 is a schematic diagram of a structure of a cross-sectional shape of a display substrate.

As shown in FIG. 8, the conventional horizontal anode 30 structure includes the first conductive layer 31, the reflective layer 32 and the second conductive layer 33. The reflective layer 32 is usually metal. Due to exposure of a side of the reflective layer 32, the metal is prone to oxidation corrosion, resulting in defects of OLED devices, such as low luminous efficiency and current leakage, which is unsuitable for the sub-pixel component anode structure without protection of pixel definition layer (PDL). In addition, in the conventional horizontal anode structure, the segment difference of the anodes is large, which is easy to cause the film layer to break during the deposition process of the OLED device, and it is impossible to realize continuous luminescence between sub-pixel components (the luminescence brightness in a blank region between the sub-pixel components is much lower than the intrinsic brightness), and it is prone to generation of poor Moire fringes.

In the display substrate of the embodiment of the present disclosure, the planarization layer 20 etches into multiple protrusion structures, and anodes 30 of the corresponding sub-pixel components are deposited over the multiple protrusions by means of layered and step-by-step etching. The structure of the anode 30 may be a multi-layer structure including the first conductive layer 31, the reflective layer 32, and the second conductive layer 33. The first conductive layer 31, the reflective layer 32 and the second conductive layer 33 are subjected to layered and step-by-step etching, thereby achieving good coating performance of the conductive layers at both sides on the metal of the intermediate reflective layer 32 and preventing the metal side of the intermediate reflective layer 32 from being oxidized. In addition, the planarization layer 20 is etched into the protrusion structure, thereby reducing critical dimension bias (CD Bias) of the etching, narrowing the blank region between the anodes 30 of the sub-pixel components, and eliminating the poor Moire fringes. In the present embodiment, the CD Bias is smaller than or equal to 0.6 μm and the blank region between the anodes 30 the sub-pixel components is smaller than or equal to 2.5 μm.

In the present embodiment, in order to achieve the coating of the anode 30 on the spherical crown-shaped planarization layer 20, the reflective layer 32 of the anode 30 has a thickness of 80 nm to 200 nm, and the conductive layers at both sides may have the thickness of 10 nm to 50 nm.

Figure 9:
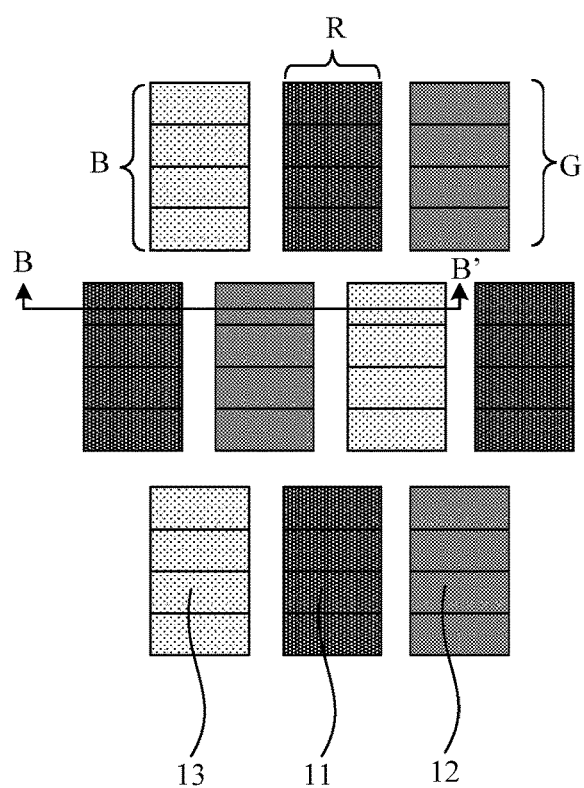
FIG. 9 is a schematic diagram of a structure of a sub-pixel arrangement of a display substrate according to an embodiment of the present disclosure.
Figure 10:
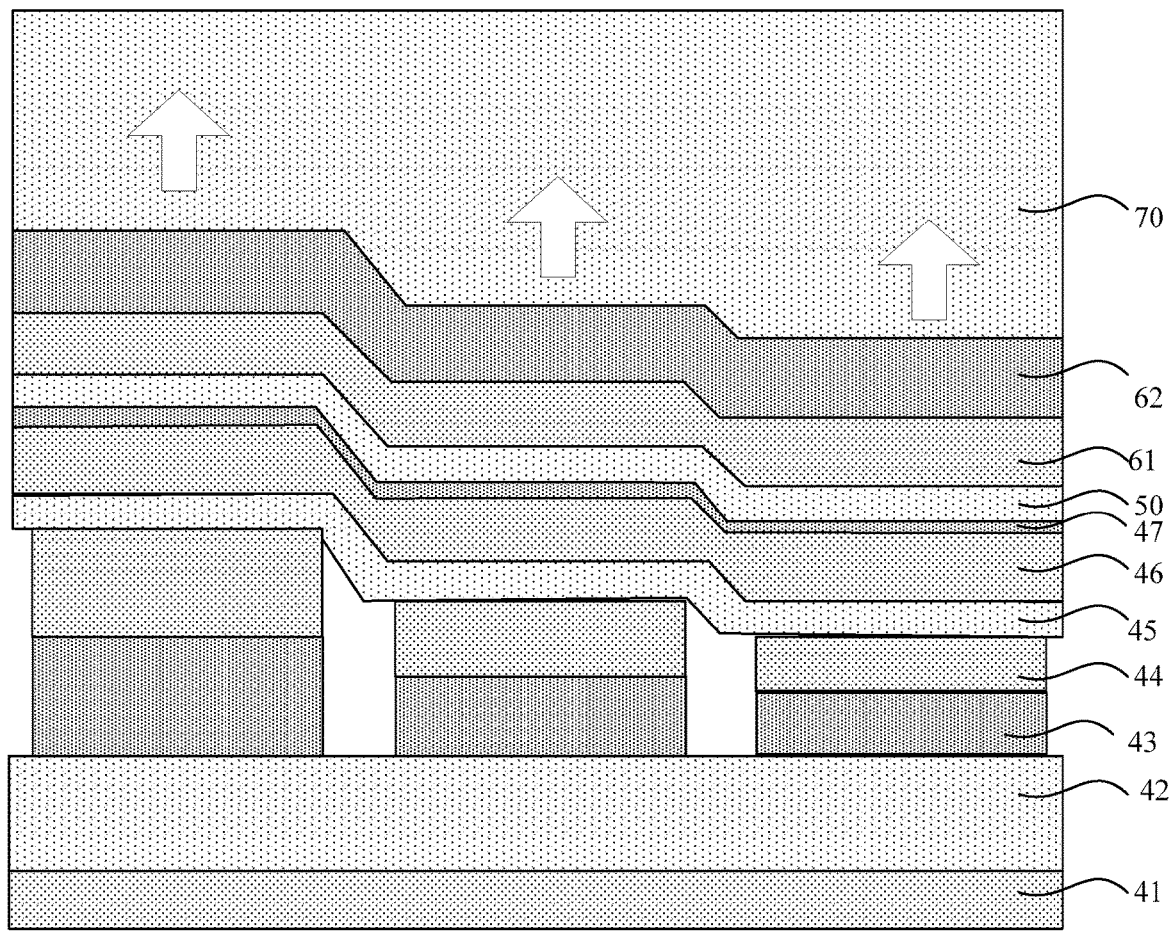
FIG. 10 is a schematic diagram of a cross-sectional shape of a BB' region of a display substrate shown in FIG. 9.

In an exemplary embodiment, as shown in FIG. 9 to FIG. 10, each pixel unit includes three sub-pixels with different colors, and each of the three sub-pixels is shared by the adjacent pixel units. In some possible implementations, each pixel unit may include four, five or more sub-pixels with different colors, which can be designed and determined according to the actual application environment, and is not limited here.

In an exemplary embodiment, the three sub-pixels with different colors may be red sub-pixel R, green sub-pixel G and blue sub-pixel B.

In an exemplary embodiment, respective sub-pixel components in the red sub-pixel R, green sub-pixel G and blue sub-pixel B have the same size and are arranged in an array.

In an exemplary embodiment, as shown in FIG. 9 to FIG. 10, each sub-pixel component 11 of the red sub-pixel R forms a first micro-cavity structure, each sub-pixel component 12 of the green sub-pixel G forms a second micro-cavity structure, and each sub-pixel component 13 of the blue sub-pixel B forms a third micro-cavity structure. Each micro-cavity structure includes an anode 30, a cathode 50 and an organic light emitting layer 40 disposed between the anode 30 and the cathode 50, and the organic light emitting layer 40 may be formed by evaporation. An optical thickness ratio of the organic light emitting layer 40 of the first micro-cavity structure in the first micro-cavity is larger than that of the organic light emitting layer 40 of the second micro-cavity structure in the second micro-cavity. The optical thickness ratio of the organic light emitting layer 40 of the second micro-cavity structure in the second micro-cavity is larger than that of the organic light emitting layer 40 of the third micro-cavity structure in the third micro-cavity.

In an exemplary embodiment, as shown in FIG. 10, the organic light emitting layer 40 includes a hole injection layer (HIL) 41A, a hole transport layer (HTL) 42, an electron barrier layer (EBL) 43, a light emitting layer (EML) 44, a hole barrier layer (HBL) 45, an electron transport layer (ETL) 46, and an electron injection layer (EIL) 47 disposed sequentially in a direction of the anode 30 toward the cathode 50. Adjustment of an optical thickness of the micro-cavity may be achieved by adjusting an optical thickness of any film layer (e.g. the hole injection layer 41) of the organic light emitting layer 40 between the anode 30 and the cathode 50.

The organic light emitting layer 40 shown in FIG. 10 is only an exemplary structure, which is not limited by the present disclosure. In practical implementation, the structure of the organic light emitting layer 40 may be designed as required.

In practical applications, the base 10 may also include structures disposed on a substrate, such as Gate Driver On Array (GOA), EM GOA (EOA), a driving circuit and a compensation circuit.

In an exemplary embodiment, the cathode 50 is manufactured using the evaporation or sputter process, which is film formation on whole surface, and the morphology of the cathode 50 is the same as the undulations on the surface of the anode 30.

The structure of the display substrate will be described below through an example of a manufacturing process of the display substrate. The "patterning process" mentioned in the present disclosure includes processes, such as film layer deposition, photoresist coating, masking and exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a thin film layer manufactured from a certain material on a base by a process of depositing or coating. If the patterning process is unnecessary for the "thin film" in the whole manufacturing process, the "thin film" may also be referred to as a "layer". If the patterning process is necessary for the "thin film" in the whole manufacturing process, the thin film is referred to as the "thin film" before the patterning process and referred to as a "layer" after the patterning process. The "layer" after the patterning process includes at least one "pattern". "A and B are disposed on the same layer" mentioned in the present disclosure refers to that A and B are simultaneously formed by the same patterning process. In the present disclosure, "an orthographic projection of A includes an orthographic projection of B" means that the orthographic projection of B falls within the range of the orthographic projection of A, or the orthographic projection of A covers the orthographic projection of B.

(1) A pattern of a driving structure layer is manufactured on the base 10. The driving structure layer include multiple gate lines and multiple data lines, and multiple pixel units arranged in an array or row-by-row staggered arrangement defined by perpendicular intersections of the multiple gate lines and the multiple data lines. Each pixel unit includes at least three sub-pixels, and each sub-pixel includes multiple sub-pixel components, and each sub-pixel component includes a thin film transistor (TFT). In the present embodiment, one pixel unit includes three sub-pixels, which are red sub-pixel R, green sub-pixel G and blue sub-pixel B. The solution of the present embodiment may also be applicable to a situation where one pixel unit includes 4 or more than 4 sub-pixels. In the present embodiment, a manufacturing process may include: cleaning the base 10 first, then manufacturing an active layer on the base 10 by a patterning process, then forming a first insulating layer covering the active layer, forming the gate lines and gate electrodes on the first insulating layer, then forming a second insulating layer covering the gate lines and the gate electrodes, and forming data lines, source electrodes and drain electrodes on the second insulating layer. The thin film transistor may be a bottom gate structure, may also be a top gate structure, may be an amorphous silicon (a-Si) thin film transistor, or may be a low temperature polysilicon (LTPS) thin film transistor or an oxide thin film transistor, which are not limited here. When actually implemented, the base 10 may adopt materials with high light transmittance, such as glass, quartz, polyalkene resin, polyethylene naphthalate resins, polyimide resins, polyterephthalic acid plastics and phenolic resins, or surface-treated polymer soft film.

Figure 11:
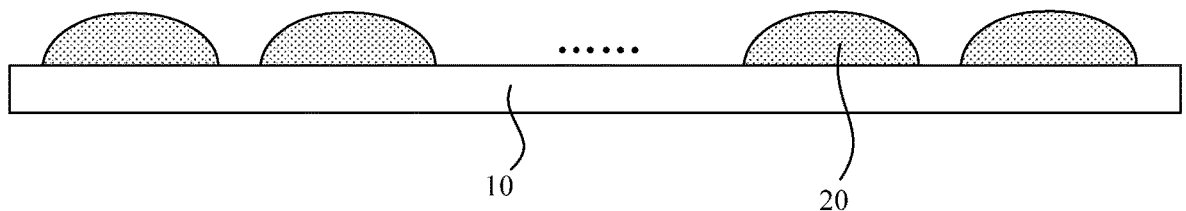
FIG. 11 is a schematic diagram of a display substrate after forming a planarization layer according to an embodiment of the present disclosure.

(2) A first planarization thin film is coated on the base 10 on which the aforementioned pattern is formed, a planarization (PLN) Layer 20 covering a whole flexible base 10 is formed. In conjunction with FIG. 6 and FIG. 11, the planarization layer 20 is etched into multiple spherical crown-shaped protrusion structures arranged in an array or row-by-row staggered arrangement (or semi-cylinder-shaped protrusion structures arranged in rows or columns). A via 21 is formed on the planarization layer 20 through a patterning process, the planarization layer 20 in the via 21 is etched away to expose a surface of a drain electrode of the thin film transistor, and a position of the via 21 may be disposed at the positions around the spherical crown-shaped protrusion or the semi-cylinder-shaped protrusion.

Figure 12:
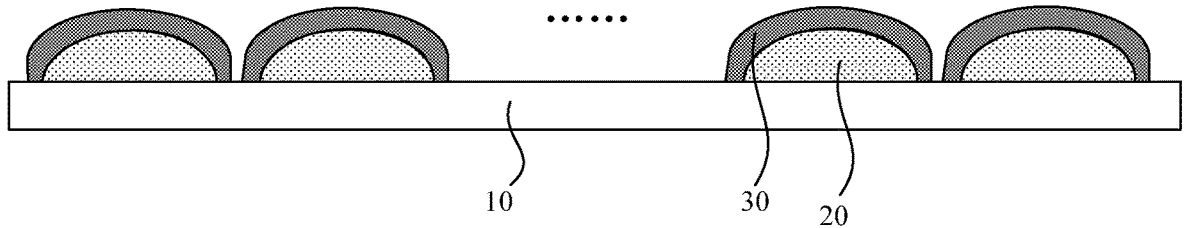
FIG. 12 is a schematic diagram of a display substrate after forming an anode according to an embodiment of the present disclosure.

(3) A pattern of an anode 30 is formed on the base 10 on which the aforementioned pattern is formed. In conjunction with FIG. 7 and FIG. 12, forming of the pattern of the anode 30 includes: depositing a first conductive thin film on the base 10 on which the aforementioned pattern is formed, coating a layer of photoresist on the first conductive thin film, exposing the photoresist with a single tone mask plate, forming an unexposed region at a position where the first conductive layer 31 is located, forming a completely exposed region at other positions, developing and removing the photoresist at the completely exposed region, then etching away the first conductive thin film at the completely exposed region and stripping the remaining photoresist to form the pattern of the first conductive layer 31; depositing a reflective thin film on the base 10 on which the aforementioned pattern is formed, coating a layer of photoresist on the reflective thin film, exposing the photoresist with the single tone mask plate, forming an unexposed region at a position where the reflective layer 32 is located, forming a completely exposed region at other positions, developing and removing the photoresist at the completely exposed region, then etching away the reflective thin film at the completely exposed region and stripping the remaining photoresist to form the pattern of the reflective layer 32; and depositing a second conductive thin film on the base 10 on which the aforementioned pattern is formed, coating a layer of photoresist on the second conductive tin film, exposing the photoresist with the single tone mask plate, forming an unexposed region at a position where the second conductive layer 33 is located, forming a completely exposed region at other positions, developing and removing the photoresist at the completely exposed region, then etching away the second conductive thin film at the completely exposed region and stripping the remaining photoresist to form the pattern of the second conductive layer 33.

The first conductive layer 31 of each sub-pixel component is connected with a drain electrode of a thin film transistor in the sub-pixel component. In the display substrate of the present embodiment, the pattern of the anode is etched by layered and step by step manner, so that the conductive layers at both sides have good coating performance on metal of the intermediate reflective layer 32, and a metal side of the intermediate reflective layer 32 is prevented from being oxidized.

(4) A pattern of a pixel definition layer is formed on the base 10 on which the aforementioned pattern is formed. Forming of the pattern of the pixel definition layer includes: coating a pixel definition thin film on the base 10 on which the aforementioned pattern is formed, exposing and developing the pixel definition thin film with the single tone mask plate to form the pattern of the pixel definition layer. The pixel definition layer includes multiple opening regions disposed at intervals, one sub-pixel is disposed in each opening region. The pixel definition layer is configured to define a light emitting region in each sub-pixel region, the light emitting region exposes anodes 30 of multiple sub-pixel components. In an exemplary embodiment, the pixel definition layer may be made of polyimide, acrylic or polyethylene terephthalate.

Figure 13:
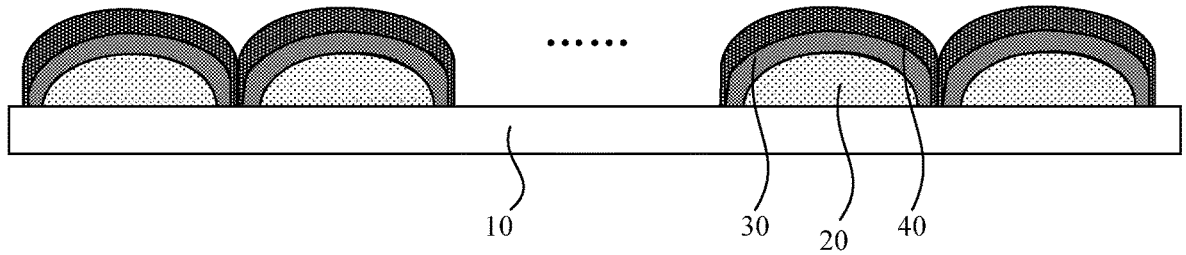
FIG. 13 is a schematic diagram of a display substrate after forming an organic light emitting layer according to an embodiment of the present disclosure.

(5) A pattern of an organic light emitting layer 40 is formed on the base 10 on which the aforementioned pattern is formed. In conjunction with FIG. 10 and FIG. 13, forming of the pattern of the organic light emitting layer 40 includes: sequentially forming patterns of a hole injection layer 41 and a hole transport layer (HTL) 42 on the base 10 on which the aforementioned pattern is formed, sequentially forming patterns of an electron barrier layer 43 and a light emitting layer 44 on the hole transport layer 42 of the multiple sub-pixel components, and sequentially forming a hole barrier layer 45, an electron transport layer 46 and an electron injection layer 47 on the base 10 on which the pattern of the light emitting layer 44 is formed.

(6) A pattern of a cathode 50 is formed on the base 10 on which the aforementioned pattern is formed. Forming of the pattern of the cathode 50 includes: depositing a cathode metal thin film on the base 10 on which the aforementioned pattern is formed, and patterning the cathode metal thin film by a patterning process to form the pattern of the cathode 50, as shown in FIG. 2. In the embodiment of the present disclosure, the cathode 50 is manufactured by evaporation or sputter process, which is film formation on whole surface, and the morphology of the cathode 50 is the same as the undulations on the surface of the anode 30. Since the OLED panel of the present embodiment is top emission structure, the cathode 50 may be a transmission electrode or a transflective electrode. The transmission electrode may be made of one of metal materials such as magnesium Mg, silver Ag, aluminum Al, copper Cu, lithium Li, or an alloy of the above metals, and the transflective electrode may be made of transflective metal.

(7) A pattern of an encapsulation layer 70 is formed on the base 10 on which the aforementioned pattern is formed, as shown in FIG. 10. Forming of the pattern of the encapsulation layer 70 includes coating a film layer of an organic material on the base 10 on which the aforementioned pattern is formed, such as tetrafluoroethylene TFE. The film layer covers the whole base 10, and the encapsulation layer 70 is formed to protect OLED panel, which completes OLED substrate structure of the present embodiment.

In an exemplary embodiment, as shown in FIG. 10, a capping layer (CPL) covering the cathode 50 is also disposed between the encapsulation layer 70 and the cathode 50 for improving light extraction efficiency. The capping layer may be a double layer structure including a first capping layer (CPL1) 61 and a second capping layer (CPL2) 62. A material for CPL1 is a material with high refractive index, and the refractive index of CPL1 is between 1.5 and 2.3. A material for CPL2 is a material with low refractive index, and the refractive index of CPL2 is between 1.3 and 1.7. The combination of high and low refractive indexes of CPL1 and CPL2 can better realize light extraction.

As may be seen from the above manufacturing flowchart, in the display substrate provided by the present embodiments, a pixel unit is divided into multiple sub-pixels, each sub-pixel is divided into multiple sub-pixel components, a cross-sectional shape of the anode 30 of each sub-pixel component is designed as a convex arc-shaped curved surface, which reduces the etching deviation, thereby greatly reducing the anode spacing between adjacent sub-pixel components and improving PPI. Moreover, the segment difference of anodes of the convex arc-shaped curved surface is small, which may realize continuous luminescence among sub-pixel components, thereby reducing the influence of Moire fringes and improving the naked-eye 3D display effect. It has the advantages of simple preparation process, high production efficiency, low production cost and high yield, and has a good application prospect.

Although the display substrate of the present embodiment is described as a top emission structure, the solution of the present embodiment is also applicable to a bottom emission structure or a double-sided emission structure, and is also applicable to large-sized or small-sized OLED panels.

In subsequent processes, a capping plate 60 is formed by a sealing process, and the capping plate and the base 10 are fixed by a sealant. Since the base 10, the capping plate and the sealant together form a closed space, protection against water and oxygen is provided, and the service life of the substrate is greatly prolonged.

Figure 14:
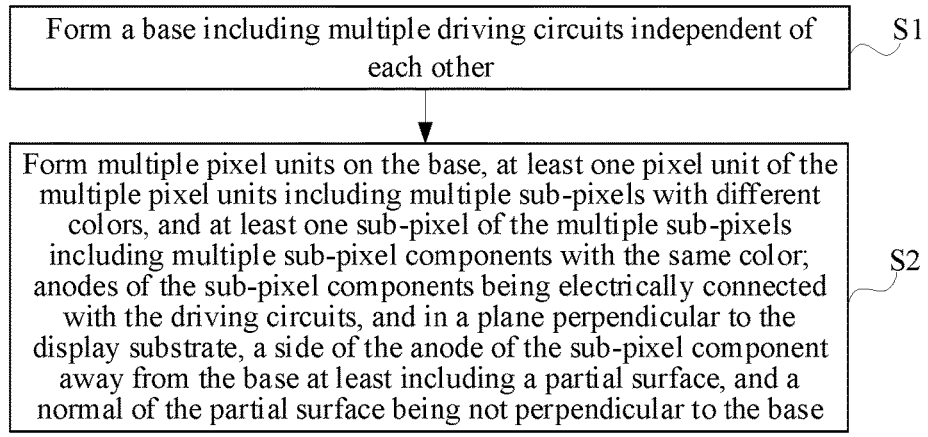
FIG. 14 is a schematic flowchart of a manufacturing method of a display substrate according to an embodiment of the present disclosure.

Embodiments of the present disclosure also provide a manufacturing method of a display substrate, the display substrate includes multiple pixel units, at least one pixel unit of the multiple pixel units includes multiple sub-pixels with different colors, and at least one sub-pixel of the multiple sub-pixels includes multiple sub-pixel components with the same color. As shown in FIG. 14, the manufacturing method includes the following acts S1 and S2.

In act S1, a base is formed, and the base includes multiple driving circuits independent of each other.

In act S2, multiple pixel units is formed on the base, at least one pixel unit of the multiple pixel units includes multiple sub-pixels with different colors, at least one sub-pixel of the multiple sub-pixels includes multiple sub-pixel components with the same color, anodes of the sub-pixel components are electrically connected to the driving circuits, and in a plane perpendicular to the display substrate, a side of the anode of the sub-pixel component away from the base at least includes a partial surface, a normal of the partial surface is not perpendicular to the base.

In an exemplary embodiments, forming of multiple pixel units on the base includes the following acts S21-S23.

In act S21, a planarization layer is formed on the base, in at least one sub-pixel region, the planarization layer includes multiple protrusions corresponding to the multiple sub-pixel components one-to-one, and multiple vias are disposed on the planarization layer.

In act S22, an anode is formed on the planarization layer, the anodes of the sub-pixel components cover on the multiple protrusions, and an anode of at least one sub-pixel component is electrically connected with at least one of the driving circuits through via on the planarization layer.

In act S23, an organic light emitting layer and a cathode are formed sequentially on the anode.

In an exemplary embodiment, the anode includes a first conductive layer, a reflective layer, and a second conductive layer. Forming of the anode on the planarization layer includes: depositing a first conductive film, and forming a pattern of the first conductive layer through a first patterning process; depositing a reflective layer thin film and forming a pattern of the reflective layer through a second patterning process; depositing a second conductive thin film, and forming a pattern of the second conductive layer through a third patterning process.

In an exemplary embodiment, the reflective layer has a thickness of 80 nm to 200 nm; the first conductive layer and the second conductive layer each have a thickness of 10 nm to 50 nm.

In an exemplary embodiment, in at least one sub-pixel region, the multiple protrusions are multiple spherical crown-shaped protrusions arranged on the base in an array or row-by-row staggered arrangement.

In an exemplary embodiment, in at least one sub-pixel region, the multiple protrusions are multiple semi-cylinder-shaped protrusions arranged on the base in rows or columns.

Embodiments of the present disclosure provide a manufacturing method of a display substrate. A pixel unit is divided into multiple sub-pixels, each sub-pixel is divided into multiple sub-pixel components, a cross-sectional shape of the anode of each sub-pixel component is designed as a convex arc-shaped curved surface, which reduces the etching deviation, thereby greatly reducing the anode spacing between adjacent sub-pixel components and improving PPI. Moreover, the segment difference of the anodes of the convex arc-shaped curved surface is small, thereby realizing continuous luminescence among sub-pixel components, thus reducing the influence of Moire fringes and improving the naked-eye 3D display effect. It has the advantages of simple manufacturing process, high production efficiency, low production cost and high yield, and has a good application prospect.

Embodiments of the present disclosure further provide a display device including display substrates of the above embodiments. The display device may be any product or component with a display function, such as a mobile phone, a tablet computer, a television, a display, a notebook computer, a digital photo frame, and a navigator.

In an exemplary embodiment, the display device may include multiple types. For example, according to an emission direction of light, the display device may be divided into a top-emission type OLED device or a bottom-emission type OLED device, The top-emission type OLED device is that an anode grown on a substrate is set as an opaque electrode, and a top cathode is set as a transparent electrode or a translucent electrode so that light emits from the top cathode when a voltage is applied. The bottom-emission OLED device is that an anode grown on a substrate is set as a transparent electrode or a translucent electrode, and a top cathode is set as an opaque electrode so that light emits from the bottom anode when a voltage is applied.

Although the implementations disclosed in the present disclosure are as above, the described contents are only implementations adopted for convenience of understanding the present disclosure and are not intended to limit the present disclosure. Any skill in the art to which the present disclosure pertains can make any modifications and variations in implementation manners and details without departing from the spirit and scope disclosed in the present disclosure. However, the scope of patent protection of the present disclosure is still subject to the scope defined by the appended claims.

The invention claimed is:

1. A display substrate, comprising a base and a plurality of pixel units disposed on the base, wherein:
    at least one pixel unit of the plurality of pixel units comprises a plurality of sub-pixels with different colors, and at least one sub-pixel of the plurality of sub-pixels comprises a plurality of sub-pixel components with the same color;
    anodes of the plurality of sub-pixel components are electrically connected with driving circuits, the driving circuits are independent of each other, and in a plane perpendicular to the display substrate, a side of an anode of at least one sub-pixel component of the plurality of sub-pixel components away from the base at least comprises a part of a surface, and a normal of the part of the surface is not perpendicular to the base; and
    the anode of the at least one sub-pixel component comprises a first conductive layer, a reflective layer, and a second conductive layer which are stacked,
    wherein the first conductive layer and the second conductive layer each have a thickness of 10 nm to 50 nm; and the reflective layer has a thickness of 80 nm to 200 nm, and
    in the plane perpendicular to the display substrate, the display substrate comprises the base, and a planarization layer, the anodes of the plurality of sub-pixel components, an organic light emitting layer and a cathode which are stacked sequentially on the base, and in at least one sub-pixel region, the planarization layer comprises a plurality of protrusions corresponding to the plurality of sub-pixel components one-to-one;
    the base comprises a plurality of driving circuits, the planarization layer is disposed with a plurality of vias, and the anode of the at least one sub-pixel component is electrically connected with a driving circuit through a via on the planarization layer, and
    in the at least one sub-pixel region, the plurality of protrusions are a plurality of spherical crown-shaped protrusions arranged on the base in an array or a row-by-row staggered arrangement, or the plurality of protrusions are a plurality of semi-cylinder-shaped protrusions arranged on the base in rows or columns.

2. The display substrate according to claim 1, wherein, in one sub-pixel region, one spherical crown-shaped protrusion has a spherical radius of 300 nm to 1800 nm.

3. The display substrate according to claim 1, wherein, the anode of the at least one sub-pixel component is shaped as a first spherical housing covering the planarization layer, an organic light emitting layer of the at least one sub-pixel component is shaped as a second spherical housing covering the anode of the at least one sub-pixel component, and anodes of adjacent sub-pixel components are isolated from each other by the organic light emitting layer; in the at least one sub-pixel region, organic light emitting layers of the plurality of sub-pixel components are continuous.

4. The display substrate according to claim 3, wherein, a distance between spherical centers of the anodes of the adjacent sub-pixel components is 2 μm to 100 μm; and the first spherical housing corresponding to the anode of the at least one sub-pixel component has a radius of 100 nm to 8000 nm.

5. The display substrate according to claim 3, wherein, the first spherical housing corresponding to the anode of the at least one sub-pixel component has an arc of $\pi/6$ to $3\pi/2$.

6. The display substrate according to claim 1, wherein, in one sub-pixel region, one semi-cylinder-shaped protrusion has a bottom surface radius of 600 nm to 700 nm.

7. The display substrate according to claim 1, wherein, the anode of the at least one sub-pixel component is shaped as a first ring cylinder covering the planarization layer, an organic light emitting layer of the at least one sub-pixel component is shaped as a second ring cylinder covering the anode of the at least one sub-pixel component, and anodes of adjacent sub-pixel components are isolated from each other by the organic light emitting layer; in the at least one sub-pixel region, organic light emitting layers of the plurality of sub-pixel components are continuous.

8. The display substrate according to claim 7, wherein, a distance between bottom surface circular centers of the anodes of the adjacent sub-pixel components is 2 μm to 100 μm; and the first ring cylinder corresponding to the anode of the at least one sub-pixel component has a bottom surface radius of 100 nm to 8000 nm.

9. The display substrate according to claim 7, wherein, the first ring cylinder corresponding to the anode of the at least one sub-pixel component has an arc of $\pi/6$ to $3\pi/2$.

10. A display device comprising the display substrate of claim 1.

11. A manufacturing method of a display substrate, comprising:

forming a base comprising a plurality of driving circuits independent of each other; and forming a plurality of pixel units on the base, at least one pixel unit of the plurality of pixel units comprising a plurality of sub-pixels with different colors, and at least one sub-pixel of the plurality of sub-pixels comprising a plurality of sub-pixel components with the same color; anodes of the plurality of sub-pixel components being electrically connected with the driving circuits, and in a plane perpendicular to the display substrate, a side of an anode of at least one sub-pixel component of the plurality of sub-pixel components away from the base at least comprising a part of a surface, and a normal of the part of the surface being not perpendicular to the base;

wherein forming the plurality of pixel units on the base comprises:

forming a planarization layer on the base, and forming the anodes of the plurality of sub-pixel components on the planarization layer; and wherein, the anode of the at least one sub-pixel component comprises a first conductive layer, a reflective layer, and a second conductive layer; and forming the anode of the at least one sub-pixel component on the planarization layer comprises:

depositing a first conductive thin film, and forming a pattern of the first conductive layer through a first patterning process;

depositing a reflective layer thin film, and forming a pattern of the reflective layer through a second patterning process; and depositing a second conductive thin film, and forming a pattern of the second conductive layer through a third patterning process.

12. The manufacturing method according to claim 11, wherein, in at least one sub-pixel region, the planarization layer comprises a plurality of protrusions corresponding to the plurality of sub-pixel components one-to-one, and a plurality of vias are disposed on the planarization layer;

the anodes of the plurality of sub-pixel components cover the plurality of protrusions, and the anode of the at least one sub-pixel component is electrically connected with at least one driving circuit through a via on the planarization layer; and the manufacturing method further comprises:

sequentially forming an organic light emitting layer and a cathode on the anodes of the plurality of sub-pixel components.

13. The manufacturing method according to claim 12, wherein, in the at least one sub-pixel region, the plurality of protrusions are a plurality of spherical crown-shaped protrusions arranged on the base in an array or a row-by-row staggered arrangement;

or in the at least one sub-pixel region, the plurality of protrusions are a plurality of semi-cylinder-shaped protrusions arranged on the base in rows or columns.

14. The manufacturing method according to claim 11, wherein, the reflective layer has a thickness of 80 nm to 200 nm; the first conductive layer and the second conductive layer each have a thickness of 10 nm to 50 nm.

* * * * *